United States Patent [19]

Morrison et al.

[11] 4,194,186
[45] Mar. 18, 1980

[54] DIGITAL HYSTERESIS CIRCUIT

[75] Inventors: Steven Morrison; Thomas K. Lisle, Jr., both of Baltimore, Md.

[73] Assignee: The United States of America as represented by the Secretary of the Air Force, Washington, D.C.

[21] Appl. No.: 898,067

[22] Filed: Apr. 20, 1978

[51] Int. Cl.² ............................................. H03K 13/02
[52] U.S. Cl. ....................... 340/347 AD; 340/347 CC
[58] Field of Search ................. 340/347 AD, 347 CC; 235/92 PE

[56] References Cited

U.S. PATENT DOCUMENTS

| | | | |
|---|---|---|---|
| 3,786,488 | 1/1974 | Ahlgren | 235/92 PE |
| 3,786,491 | 1/1974 | Carleton | 340/347 CC |
| 4,084,082 | 4/1978 | Alfke | 235/92 PE |

Primary Examiner—Charles D. Miller
Attorney, Agent, or Firm—Joseph E. Rusz; Willard R. Matthews, Jr.

[57] ABSTRACT

Noise induced hunting is eliminated in successive ranged digital/analog converter bias correction circuits by means of a digital hysteresis circuit. The digital hysteresis circuit comprehends a first up/down counter that counts to its extremums from a pre-set intermediate state in response to enable and up/down input signals. For each extremum count an enable output pulse and a reset pulse is generated at the counter output. The enable output pulses are counted by a second up/down counter the output of which drives a digital/analog converter. Each reset pulse resets the first up/down counter to its pre-set state.

2 Claims, 5 Drawing Figures

DIGITAL HYSTERESIS CIRCUIT

BACKGROUND OF THE INVENTION

This invention relates to bias error adjustment circuits of the type utilized in successive ranged digital/analog converter (SRADC) systems and in particular to a digital hysteresis circuit for eliminating noise induced hunting in these and other systems.

In a successively ranged analog/digital converter several bits are converted at a time in order to increase the speed over that of a successive approximation analog/digital converter which converts one bit at a time. In the SRADC type of device analog input signals are processed through an analog chain and fed to an n bit parallel analog/digital converter. The analog chain is the portion of the SRADC that determines the maximum operating speed. In order to reduce the propagation time through the analog chain the highest speed amplifiers available are utilized and hot carrier diode switches are used for gain switching. Also the amplifiers are operated over as low an output voltage swing as is feasible. These measures tend to increase bias errors, however. Hot carrier diode switches inherently produce bias errors, high speed amplifiers do not necessarily have good d.c. characteristics and the ratio of output offset to true signal is increased.

The input to the n bit parallel analog/digital converter goes through its range of possible voltage levels in every sub-range as the analog input goes through its full dynamic range. Bias errors in the analog chain can produce saturation of the analog/digital converter in some sub-ranges for a given analog input. This produces discontinuities in the final/digital converter output. Automatic bias correction circuits that obviate the adverse effects of the foregoing enumerated sources of bias error are described in our co-pending patent application entitled *AUTOMATIC BIAS ADJUSTMENT CIRCUIT FOR A SUCCESSIVE RANGED ANALOG/DIGITAL CONVERTER*, Ser. No. 898,047, filed on even date herewith. Although these circuits represent a substantial improvement over prior art approaches to the problem, the bias correction voltages generated by them hunt about normal levels due to noise and gain errors. That is, the fact that the inputs to the system parallel analog/digital converter at the end of each sub-range are not compact due to noise and gain errors causes the up/down counters to be enabled in a somewhat random fashion. Although the action will not cause the sub-ranges to be off center since the average values of the digital/analog outputs are correct, the hunting action that occurs is objectionable and must be eliminated. The digital hysteresis circuit of the invention provides the means for achieving that end.

SUMMARY OF THE INVENTION

The digital hysteresis circuit of the invention comprises an up/down counter circuit that counts between its extremums and has a preset operating state that is determined by its data inputs. The preset operating state is preferrably approximately mid-point between the counter extremums. The counter utilizes three control signals; an enable signal, an up/down signal and a reset signal. When the counter counts to either extremum an output signal pulse is generated that is used to increment or decrement a second up/down counter. Each extremum state count also effects the generation of a reset signal pulse that actuates a flip flop circuit which in turn resets the counter to its preset operating state.

It is a principal object of the invention to provide a new and improved digital hysteresis circuit.

It is another object of the invention to provide means for eliminating hunting in successive ranged digital/analog converter bias correction circuits.

There together with other objects features and advantages of the invention will become more readily apparent from the following detailed description when taken in conjunction with the illustrative embodiment in the accompanying drawings.

DETAILED DESCRIPTION OF THE PREFERRED EMBODIMENT

Figure 1:
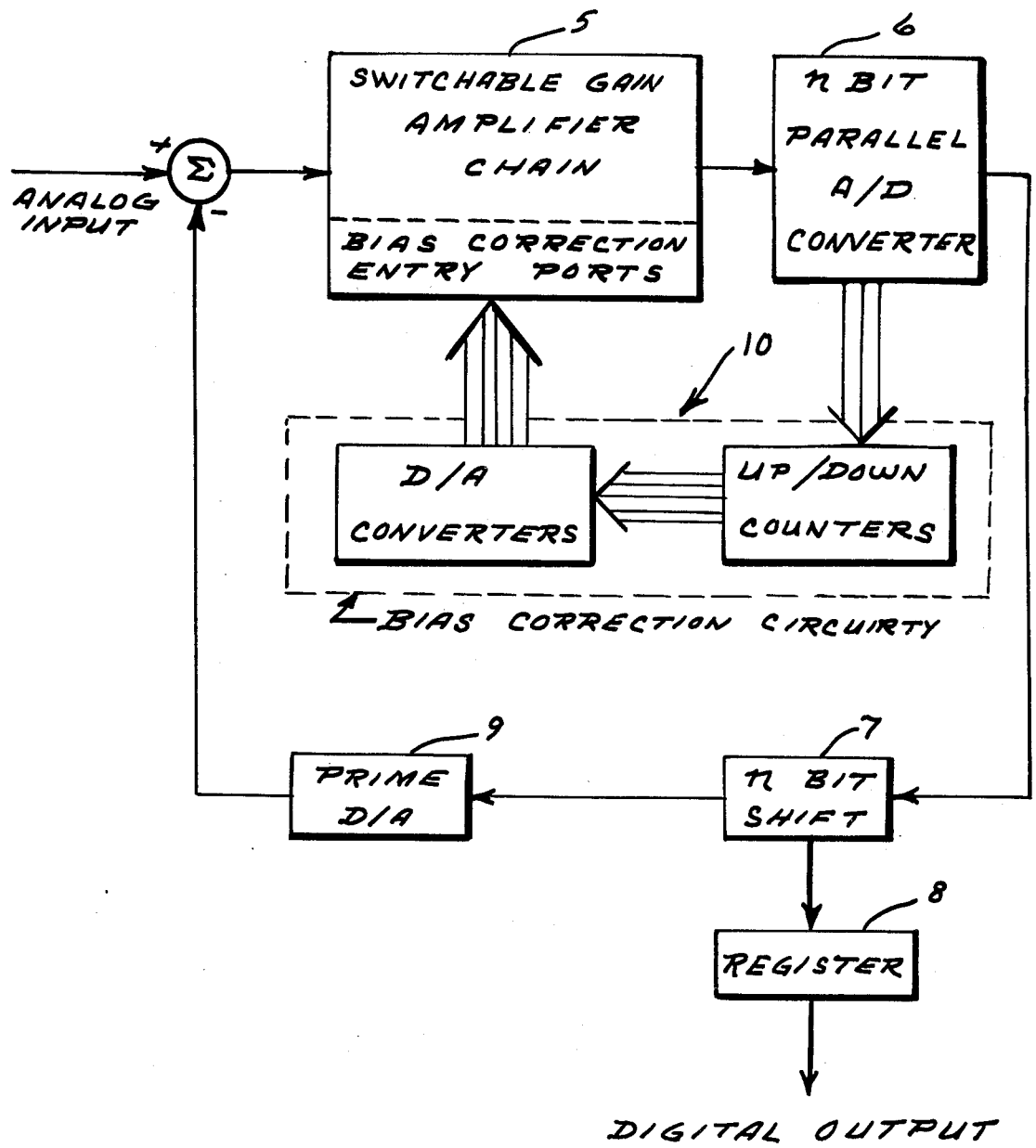
FIG. 1 is a block diagram of a successive ranged analog/digital converter including a bias correction circuit.

Referring to the block diagram of FIG. 1 there is disclosed the type of successive ranged analog/digital converter into which the digital hysteresis circuit of the invention can advantageously be incorporated. It comprises analog switchable gain amplifier chain 5, n bit parallel analog/digital converter 6, n bit shift 7, register 8, prime digital/analog converter 9 and summing means 11. The bias correction circuitry 10 is fed from the comparator circuit of n bit parallel analog/digital converter 6 and supplies its bias correction signals to switchable gain amplifier chain 5 as hereinafter described.

Operation of the successive ranged analog/digital converter is as follows: The output from n bit parallel analog/digital converter 5 is loaded into successively lower order bits of register 8 which addresses the Prime digital/analog Converter 9. In a given sub-range the Prime digital/analog converter is subtracted from the analog input by summing means 11 and amplified by the analog chain of switchable gain amplifier chain 5. The gain of this analog chain increases by $2^n$ for each succeeding subrange. The output from the analog chain is analog to digital converted to generate the next n bits of the final analog/digital output.

Figure 2:
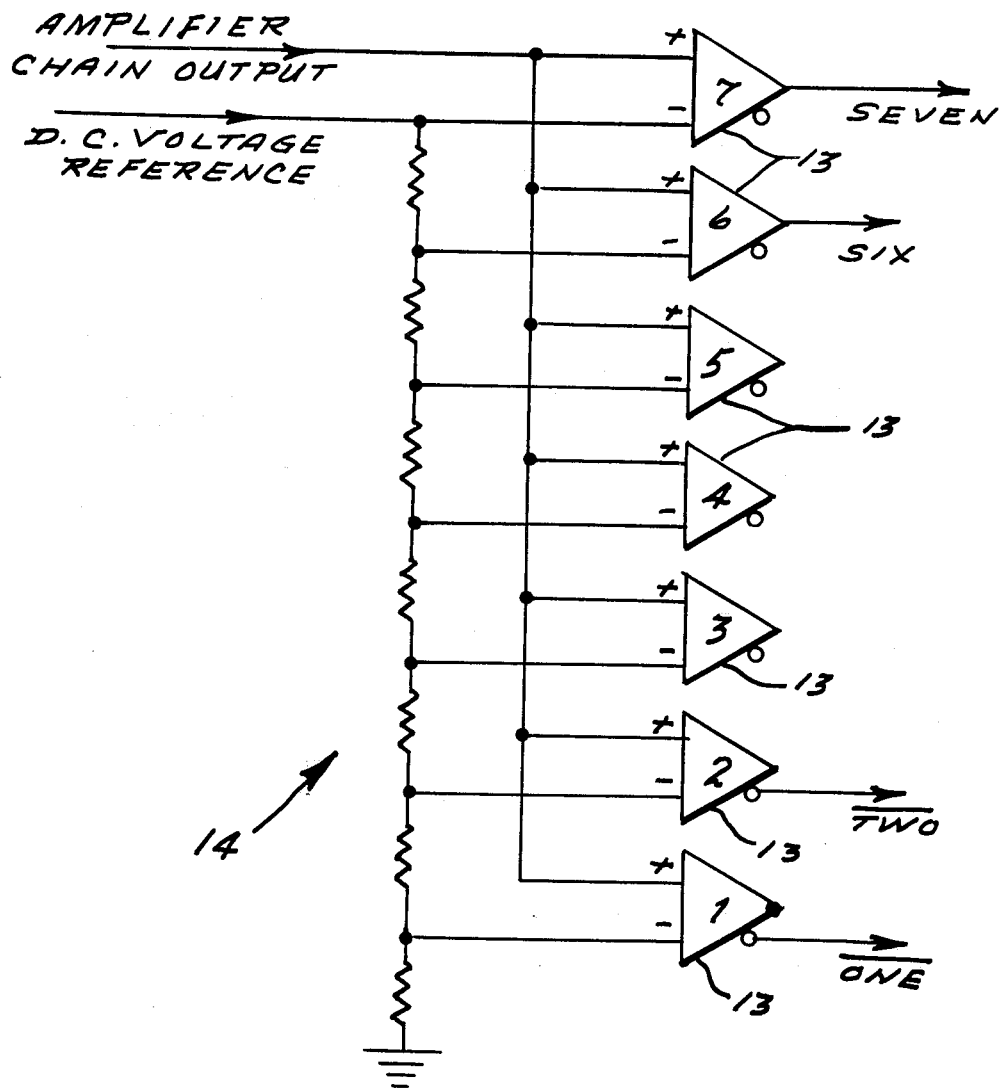
FIG. 2 is a schematic drawing of the comparator network of the n bit parallel analog/digital converter of FIG. 1.

The n-bit parallel analog/digital converter 6 contains $2^{n-1}$ comparators. FIG. 2 is a schematic diagram of the comparator network. The input signal is applied directly to the non-inverting inputs of every comparator 13. The inverting inputs of the comparators are connected to taps of a linear voltage divider 14 connected between ground and a voltage reference. Thus as the input to the analog/digital converter traverses its range from minimum to maximum, the comparator outputs progress from all "zero" logic state outputs to all ones in a linear fashion.

Figure 3:
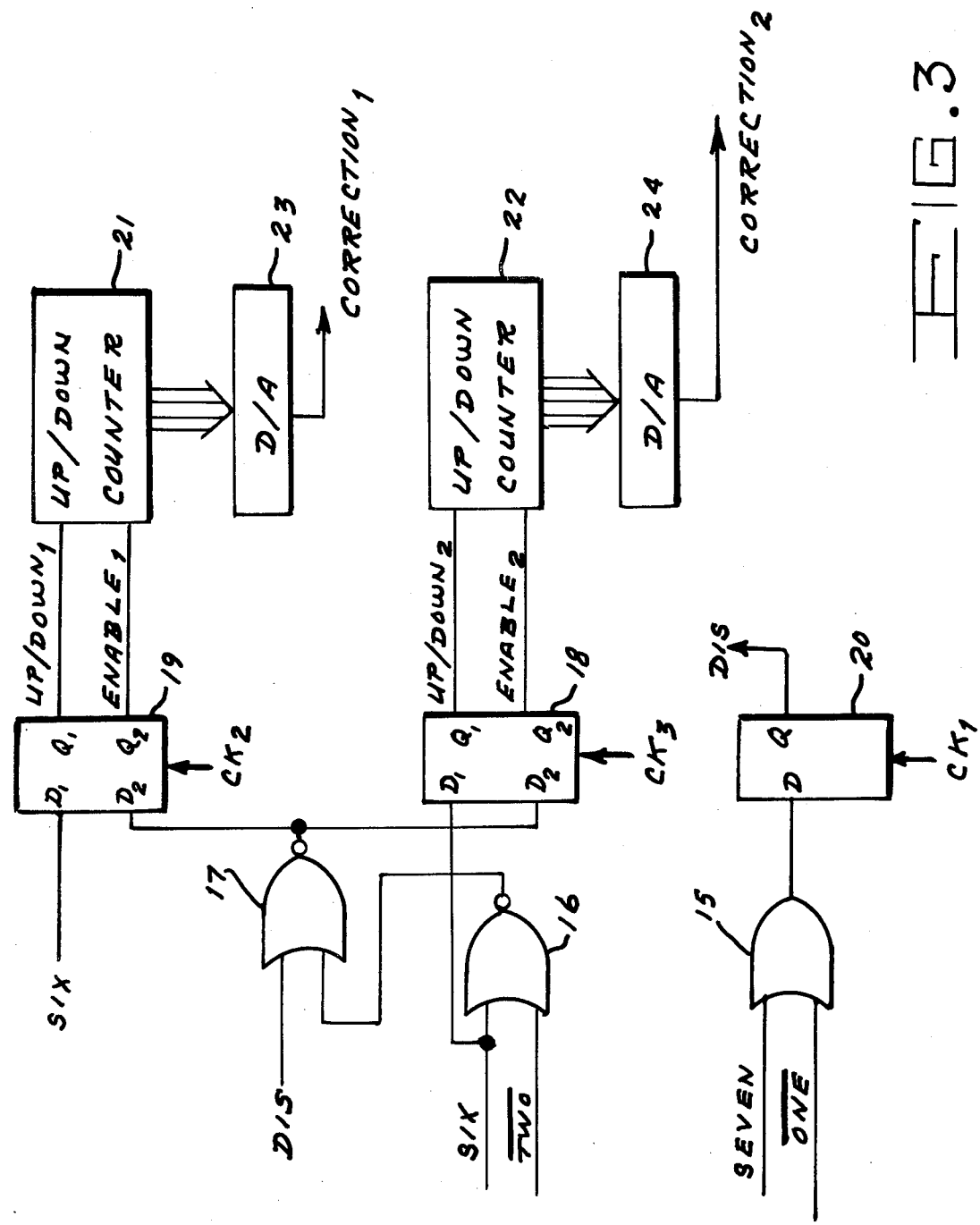
FIG. 3 is a schematic diagram of the bias correction circuit of FIG. 1.

FIG. 3 is a simplified diagram of one possible circuit which mechanizes the bias correction circuitry 10. It comprises OR gate 15, NOR gates 16, 17, flip flop 20, dual flip flops 18, 19, up/down counters 21, 22 and digital/analog converters 23, 24. Operation of the circuit is as follows: At the end of the first subrange the function SEVEN+ONE is strobed by clock CK1 into a flip flop 20. The output from this flip flop (DIS) will disable the operation of the corrective circuitry. That is, during the first subrange, when the most significant bits are generated, the corrective circuitry is disabled because saturation in this range (7<INPUT<1) means that the analog input has exceeded its dynamic range. Clock CK2 strobes the function SIX+TWO (if DIS=0) and SIX into dual flip flop 19. If the strobed function SIX+TWO=ENABLE 1 is equal to a logic one then corrective action must occur and ENABLE 1 enables up/down counter 21 whose output bits drive digital/analog converter 23. The direction of the counter (UP or DOWN) is determined by SIX at the time of CK2. If SIX is a logic one then the counter must count up. The signal CORRECTION 1 out of digital-/analog converter 23 is applied to the SRADC analog chain at a point where it will have the most effect for correcting bias errors in that subrange. The action in the next subrange is identical to that in subrange hereinabove described so that this scheme can be extended to any number of subranges as is desired.

Figure 4:
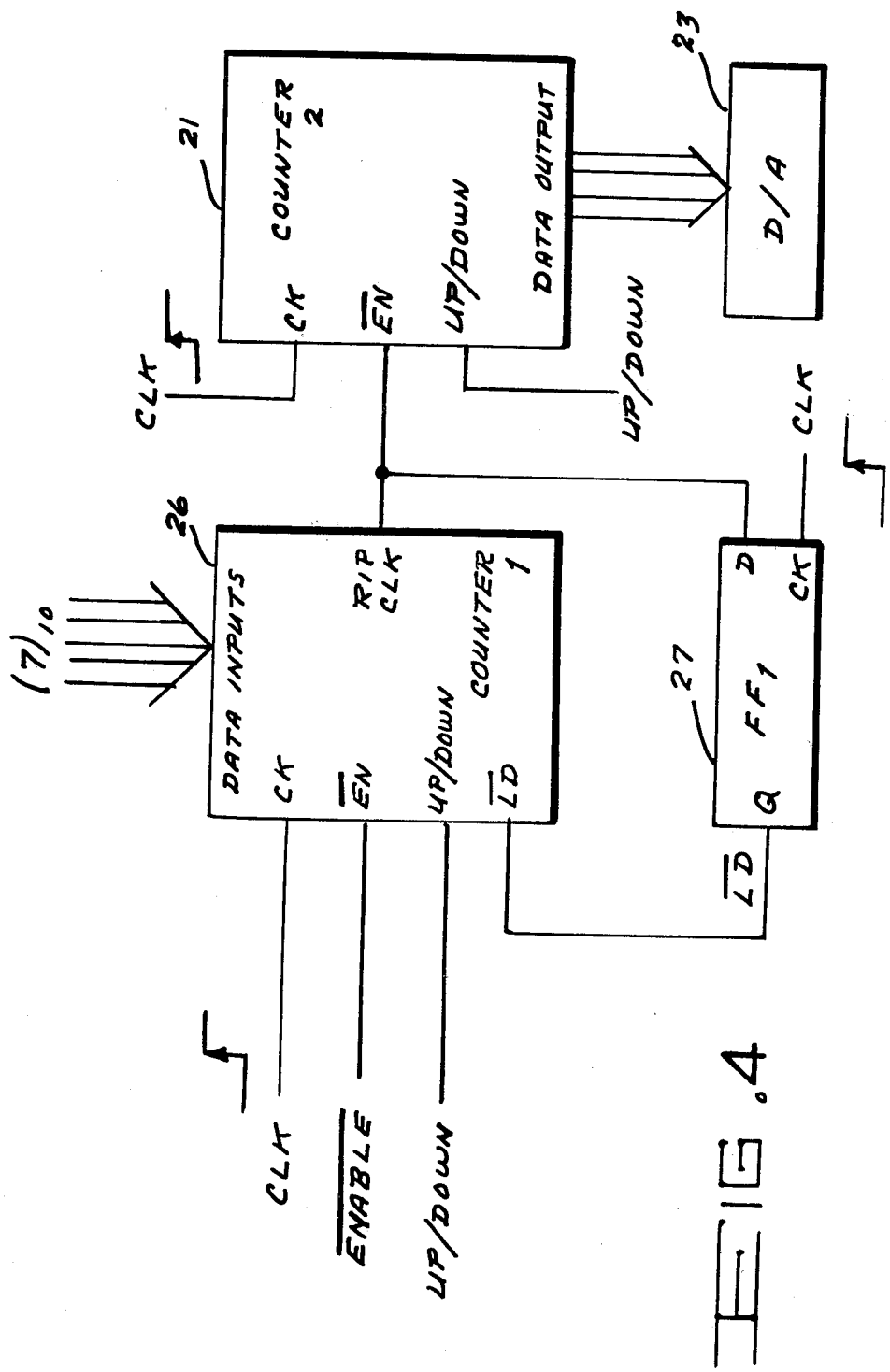
FIG. 4 is a block diagram of the digital hysteresis circuit of the invention.

The digital hysteresis circuit of the invention involves two counters 21, 26. Counter 21 addresses the digital-/analog converter 23 as shown in FIG. 4. It is assumed for ease of discussion that each counter is 4 bits in width although the number of bits can easily be increased as determined by the requirements of a given application. The counter chip utilized requires the following control signals:

(1) $\overline{\text{ENABLE}}$—this signal enables the counter.
(2) UP/DOWN—determines the direction of count.
(3) $\overline{\text{LD}}$—the counter asynchronously assemes a state determined by 4 preset inputs when $\overline{\text{LD}}=0$.

By way of example, counter 26, produces a low level pulse equal in width to the low level portion of the clock when the counter is in the $(0)_{10}$ state and the $(15)_{10}$ state.

When counter 26 reaches an extremum state, a ripple clock pulse is generated that enables counter 21. The ripple clock output which is normally high is clocked into flip flop 27 on the next clock pulse. The 0 output ($\overline{\text{LD}}$) of flip flop 27 then goes low which presets counter 26 to a state determined by the data inputs.

Figure 5:
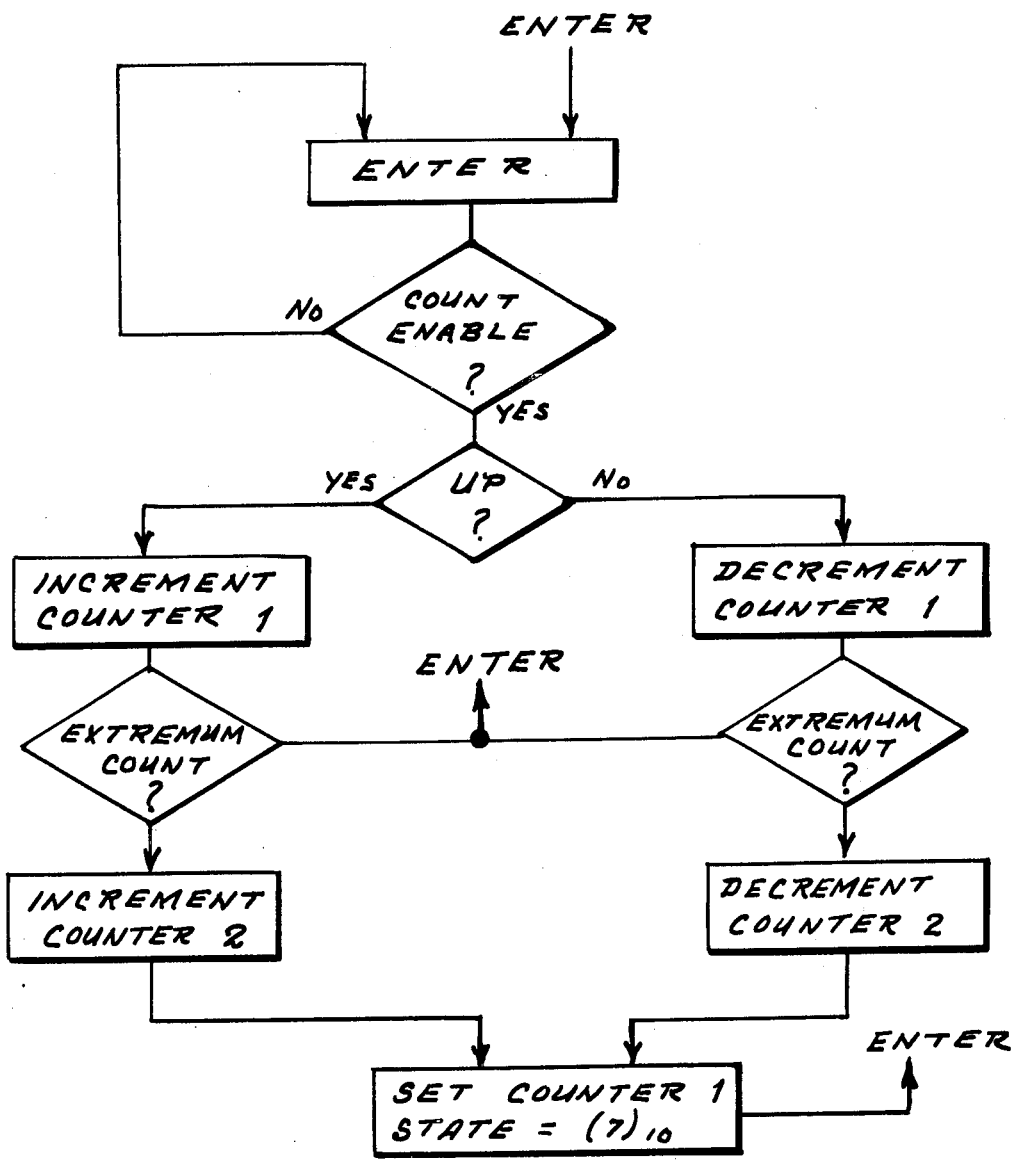
FIG. 5 is a flow diagram of the invention.

The performance of the disclosed circuit can be easily described using the flow diagram of FIG. 5. Whenever a counter enable is generated counter 26 either counts up or down depending on the sense of the up/down control line. If counter 26 reaches an extremum state it generates a ripple clock pulse which will allow counter 21 to be incremented or decremented. When this occurs counter 26 is set to state $(7)_{10}$. Thus if one of the subranges is truly off center counter 21 will be incremented once for every eight clock pulses or decremented once for every seven clock pulses. If however, counter 26 is alternately incremented and decremented, counter 21 will not be effected. A conventional two counter configuration will operate similarly if the first counter were operating about state $(7)_{10}$. But if the above configuration were operating close to an extremum state the desired action will not occur, i.e., counter 21 would be enabled. The critical point is that in the disclosed circuit counter 26 is set to state $(7)_{10}$ after it reaches an extremum state. Thus eventually any alternating action in counter 26 will be about state $(7)_{10}$. The overall effect is that of a deadband which eliminates the hunting observed in the D/A outputs.

The digital hysteresis circuit hereinabove described has been developed for use in a successive ranged analog/digital converter with bias correction. The disclosed circuit has the effect of eliminating noise induced hunting in digital/analog converter bias correctors. The utilization of this circuit, however, need not be limited to this application but can be used wherever a sharp cutoff low pass filter response is desired in a digital control loop. Accordingly, it is pointed out that although the invention has been described in terms of one presently preferred embodiment it is understood that the words which have been used are words of description rather than words of limitation and that changes within the purview of the appended claims may be made without departing from the scope and spirit of the invention it its broader aspects.

What is claimed:

1. In a successive ranged analog/digital converter having a switchable gain amplifier chain and an n bit parallel analog/digital converter, the improvement of an automatic bias adjustment circuit with hunting elimination means, said automatic bias adjustment circuit comprising a first up/down counter means for counting between extremum states in response to enable and up/down input signals and having a pre-set state intermediate said extremum states, said first up/down counter means generating an enable output pulse and a reset pulse for each extremum state count, means for re-setting said first up/down counter means to said pre-set state in response to each said reset pulse, a second up/down counter means receiving enable pulses from said first up/down counter means, digital/analog converter means driven by said second up/down counter means and providing bias correction signals in response thereto, a logic circuit for developing from said n bit parallel analog/digital converter first and second logic functions, said logic functions defining a given sub-range, and up/down counter actuating means receiving said first and second logic functions and clock signals, said actuating means enabling said first up/down counter means in response to said first logic function and effecting counting thereby in a direction dictated by the state of said second logic function.

2. An automatic bias adjustment circuit as defined in claim 1 including disabling means for disabling said up/down counter actuating means in response to logic functions defining the first sub-range of said successive ranged analog/digital converter.

* * * * *